United States Patent
Brambilla et al.

(10) Patent No.: US 6,251,736 B1
(45) Date of Patent: Jun. 26, 2001

(54) METHOD FOR FORMING CONTACTLESS MOS TRANSISTORS AND RESULTING DEVICES, ESPECIALLY FOR USE IN NON-VOLATILE MEMORY ARRAYS

(75) Inventors: Claudio Brambilla, Concorezzo; Sergio Manlio Cereda, Lomagna; Paolo Caprara, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/473,368

(22) Filed: Dec. 28, 1999

(30) Foreign Application Priority Data

Dec. 29, 1998 (EP) ................................................ 98830794

(51) Int. Cl.⁷ ................................................ H01L 21/336
(52) U.S. Cl. ......................... 438/303; 438/301; 438/306; 438/976
(58) Field of Search ................................... 438/142, 303, 438/301, 299, 198, 305, 306, 976

(56) References Cited

U.S. PATENT DOCUMENTS

| | | | |
|---|---|---|---|
| 4,603,472 | 8/1986 | Schwabe et al. | 29/576 B |
| 4,728,617 | * 3/1988 | Woo et al. | 437/30 |
| 5,045,486 | * 9/1991 | Chittipeddi et al. | 437/41 |
| 5,298,446 | 3/1994 | Onishi et al. | 437/41 |
| 5,389,809 | 2/1995 | Haken et al. | 257/344 |
| 5,482,876 | * 1/1996 | Hsieh et al. | 437/40 |
| 5,972,760 | * 10/1999 | Ju | 438/305 |
| 6,078,078 | * 6/2000 | Gardner et al. | 257/330 |

FOREIGN PATENT DOCUMENTS

| | | |
|---|---|---|
| 0573728B1 | 12/1993 | (EP) . |
| 06077495 | 3/1994 | (JP) . |
| 09237845 | 9/1997 | (JP) . |

* cited by examiner

*Primary Examiner*—Richard Elms
*Assistant Examiner*—Adam Pyonin
(74) *Attorney, Agent, or Firm*—Theodore E. Galanthay; Robert Ianucci; Seed IP Law Group, PLLC

(57) ABSTRACT

A process for manufacturing a MOS transistor and especially a MOS transistor used for non-volatile memory cells is presented. At the start of the manufacturing, a semiconductor substrate having a first type of conductivity is covered by a gate oxide layer. A gate electrode is formed over the gate oxide layer, which is a stacked gate when the MOS transistor is used in a non-volatile memory. Covering the gate electrode is a covering oxide that is formed over the gate oxide layer, the gate electrode, and around the gate electrode. Next, a dopant of a second type of conductivity is implanted to provide implant regions adjacent to the gate electrode. Subjecting the semiconductor to thermal treatments allows the implanted regions to diffuse into the semiconductor substrate under the gate electrode and form a gradual junction drain and source region of the MOS transistor.

15 Claims, 3 Drawing Sheets

METHOD FOR FORMING CONTACTLESS MOS TRANSISTORS AND RESULTING DEVICES, ESPECIALLY FOR USE IN NON-VOLATILE MEMORY ARRAYS

TECHNICAL FIELD

This invention relates to an improved process for manufacturing a MOS transistor in an integrated semiconductor substrate, and more specifically to a process for manufacturing a transistor use in forming non-volatile, contactless, memory cells integrated in electrically programmable EPROM or Flash EPROM matrices.

BACKGROUND OF THE INVENTION

The invention relates, particularly but not exclusively, to a process for manufacturing MOS transistors for use in forming non-volatile memory cells, specifically cells which are integrated in electrically programmable EPROM or Flash EPROM matrices of the contactless type and having a so-called "tablecloth" or cross-point structure, and the description herein below makes reference to this field of application for convenience of explanation. Discussion of steps or devices well known to those skilled in the art has been abbreviated or eliminated for brevity.

Integrated semiconductor EPROM or Flash EPROM electronic memory devices include a large number of memory cells organized into a matrix; that is, cells that are arranged into rows or word lines, and columns or bit lines. Each individual non-volatile memory cell is made from an MOS transistor having a floating gate electrode located above a channel region, i.e., the floating gate shows a high d.c. impedance to all the other terminals of the same cell and to the circuit in which the cell is incorporated.

The cell also has a second electrode, referred to as the control gate, which is driven by appropriate control voltages. Other electrodes of the transistor are the conventional drain, source and body terminals.

In recent years, considerable effort has been made to provide memory devices of higher circuit density. This has led to the development of electrically programmable non-volatile memory matrices of the contactless type, having a so-called "tablecloth" or cross-point structure. One example of a matrix of this kind and its fabrication process is disclosed in European Patent No. 0 573 728 to this Applicant, and hereby incorporated by reference.

In matrices of this type, the memory cells have source and drain regions formed in the substrate by continuous parallel diffusion strips, known as the bit lines, substantially coincident with the matrix columns. In memory matrices of conventional structure this function is served by metal strips connecting individual contacts formed in the drain regions of the cells in one column.

A contactless matrix requires virtual ground circuitry for reading and programming operations. However, the savings in circuit area afforded by such a structure is remarkable, allowing approximately of one order of magnitude higher number of contacts to be provided.

Another reference for this kind of circuit architectures is an article "Alternate Metal Virtual Ground (AMG)—A new Scaling Concept for Very High Density EPROM's", by Boaz Eiten, IEEE, August 1991, Vol, 12, No. 8.

In this type of a virtual ground matrix, multiple layer parallel strips are defined which include a layer of gate oxide, a first polysilicon layer, an interpoly dielectric layer, and a capping polysilicon layer known as the Poly Cap. These strips form the gate electrodes of the memory cells.

In openings between the various gate electrodes, an implantation, e.g., of arsenic where the substrate is of the P type, is performed to provide the source and drain region diffusion (bit lines).

At this stage of the process, the gate electrodes, which are located between previously exposed bit lines, are sealed to permit the implanting steps. An oxidation step allows the dopant to be diffused under the gate electrodes.

This technique makes the length of the channel region quite difficult to control, where the cell size is small, especially those sized less than 0.4–0.5 µm. The actual length of the channel region of a MOS transistor is dependent on: the size of the gate electrode, itself dependent on photolithography and etching operations on polysilicon layers; implantations in the channel region controlling the cell performance in terms of threshold voltage and current; and the lateral diffusion of the source/drain regions due to the thermal treatments to which the semiconductor is subjected after the implanting step.

SUMMARY OF THE INVENTION

Embodiments of the present invention provide an improved process for manufacturing MOS transistors, e.g., as incorporated to electronic memory devices integrated in a semiconductor and organized into virtual ground cell matrices, whereby transistors can be formed with a longer channel than in prior art devices.

Embodiments of the invention implant the source/drain regions of the transistor after covering its gate electrode with a dielectric layer, so that the implanted source/drain regions can be kept away from the walls of the gate electrode and the length of the channel region underlying the gate electrode can be more easily controlled throughout the subsequent thermal processing.

Presented is a process for manufacturing a MOS transistor that begins with forming a layer of gate oxide over a semiconductor substrate, and forming a gate electrode over this oxide layer. Then, a layer of covering oxide is formed over the gate oxide layer, the gate electrode, and around the gate electrode. Next a dopant is implanted to provide implanted regions adjacent to the gate electrode, and the semiconductor is subjected to thermal treatments that cause the implanted regions to diffuse into the semiconductor substrate under the gate electrode, and form gradual junction drain and source regions of the transistor.

The features and advantages of a device according to the invention will be apparent from the following description of an embodiment thereof, given by way of non-limitative example with reference to the accompanying drawings.

DETAILED DESCRIPTION

Figure 1:
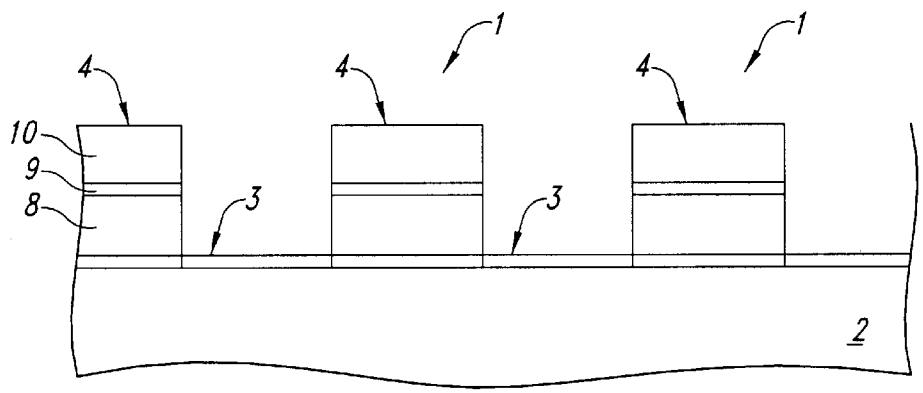
FIGS. 1 to 3 are cross sectional views of a portion of a semiconductor substrate during the course of a fabrication process according to an embodiment of the invention.

Referring to the drawings, the process flow for forming MOS transistors in accordance with an embodiment of this invention will now be described in detail. The process steps and structures described herein below do not reflect a complete process flow for manufacturing integrated circuits. The invention can be practiced in combination with integrated circuit manufacturing techniques currently employed in the industry, and only such commonly used process steps as are necessary for an understanding of this invention will be considered.

The Figures show cross-sectional views, through portions of an integrated circuit during its fabrication, which are not to scale and merely drawn to highlight important features. This description refers to a preferred embodiment using N-channel MOS transistors. For P-channel transistors, the types of conductivities mentioned herein below should be reversed.

As shown in FIG. 1, formation of a transistor 1 begins with a layer of a gate oxide 3 being formed over a P type semiconductor substrate 2. This is followed by the formation of the gate electrodes 4 of the transistor 1. Specifically, where these transistors 1 are incorporated in non-volatile memory cells, the formation of gate electrodes 4 of the transistors 1 includes a multiple deposition for providing a ply structure of: a first polysilicon layer 8 (also known as the POLY1), an intermediate dielectric layer 9, and a second polysilicon layer 10 (POLY CAP).

By a conventional photolithographic operation, the ply structure is cascade etched away to form the gate electrodes 4 in this order: the second conducting layer 10, intermediate dielectric layer 9, and the first conducting layer 8.

Alternatively, the transistor 1 could be provided with a gate electrode 4 comprising a single conducting layer (not shown).

Figure 2:
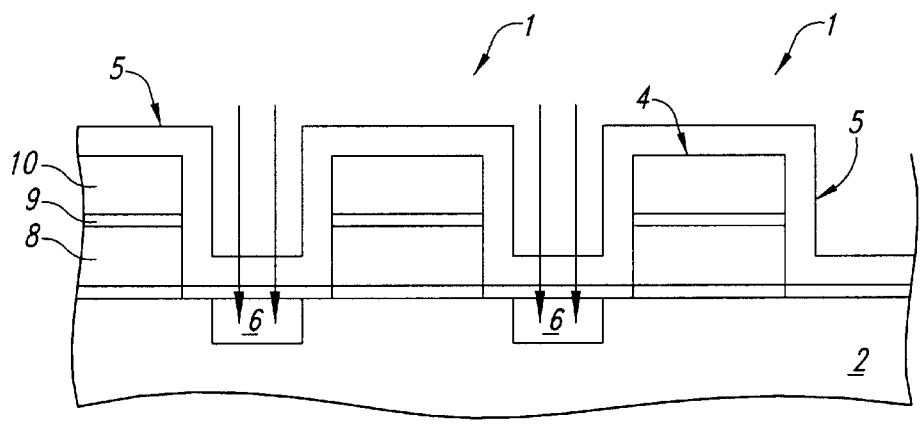
Figure 3:
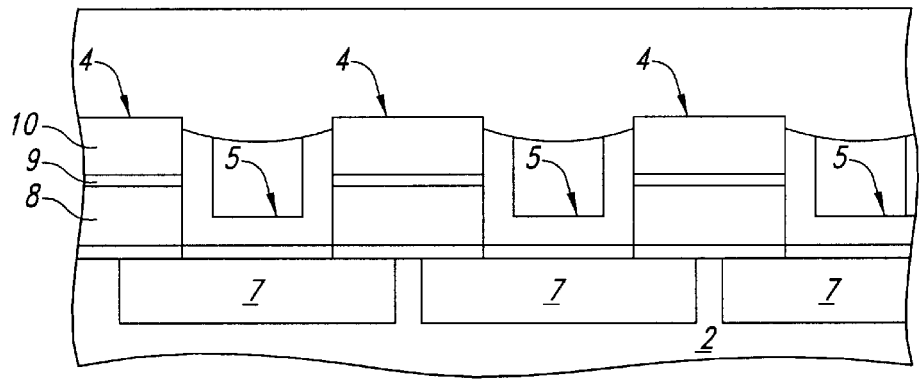
Figure 4:
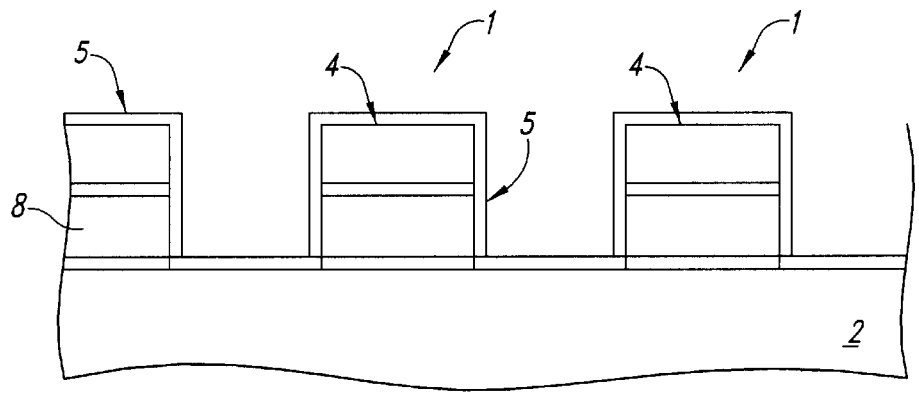
FIGS. 4 to 8 are cross sectional views of a portion of a semiconductor substrate in the course of a second embodiment of the fabrication process according to the invention.
Figure 5:
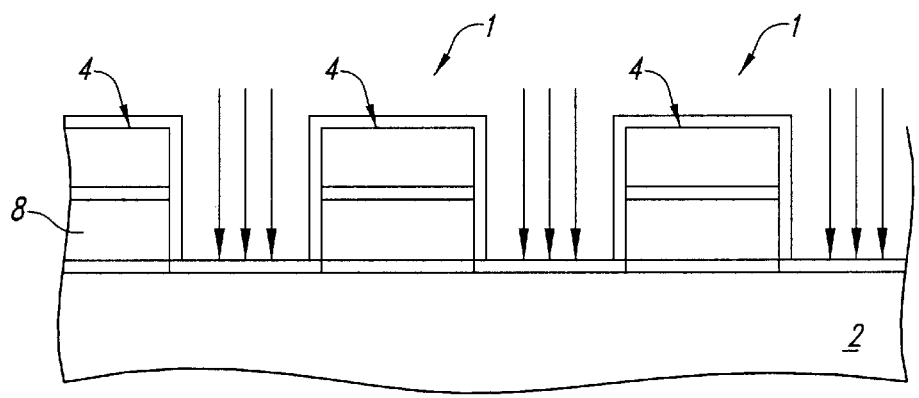
Figure 6:
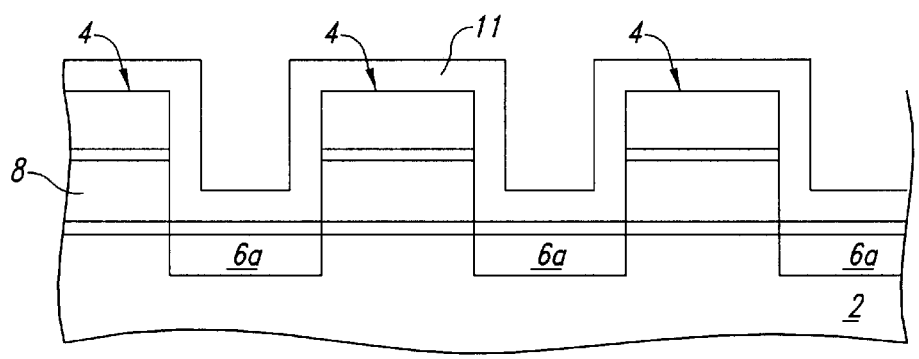
Figure 7:
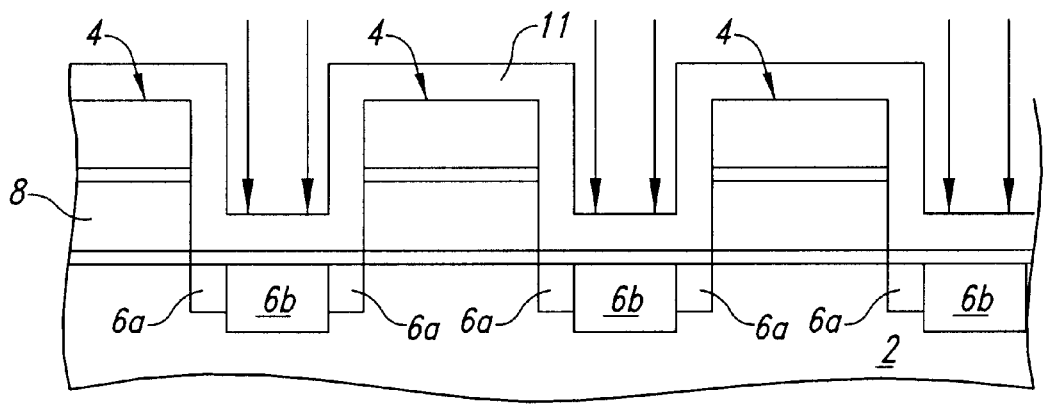
Figure 8:
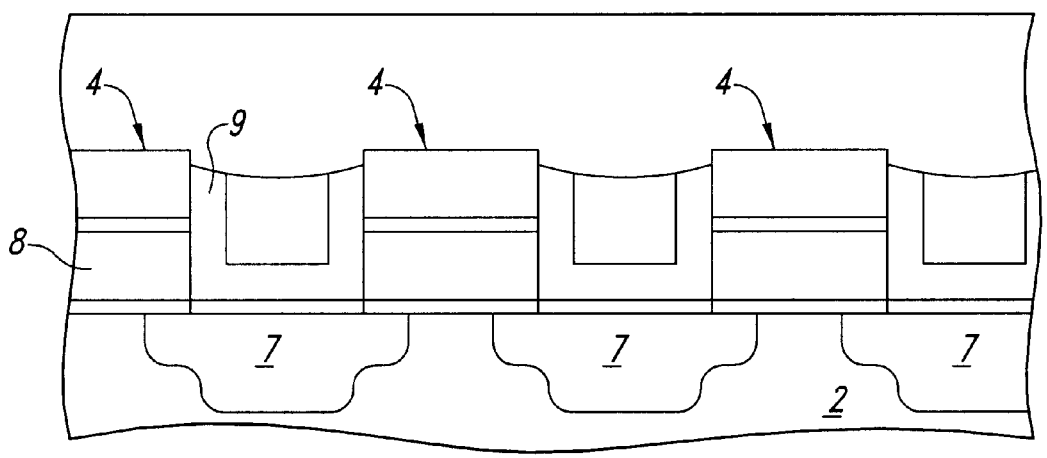

At this stage of the process flow, a covering dielectric layer 5 is formed over the gate oxide layer 3, the gate electrode 4, and around the gate electrode 4. This is shown in FIG. 2. Advantageously, this covering dielectric layer 5 is formed by a deposition of the dielectric layer onto the gate oxide layer 3. Advantageously, the thickness of this covering dielectric layer 5 is at least 500 Angstroms.

An ion implantation step is then carried out using arsenic ions, for example, to define implanted regions 6 adjacent to the gate electrode 4. The energy used for this ion implantation step should be such that the maximum dopant concentration peak is allowed to go through said covering oxide layer 5, and into the silicon substrate 2.

Providing the covering dielectric layer 5 prevents these implanted regions 6 from becoming aligned to the sidewalls of the gate electrode 4, and keeps them a distance away from the sidewalls which is equal to the thickness of the covering dielectric layer 5.

The semiconductor substrate 2 is then subjected to a thermal treatment where the implanted regions 6 diffuse into the substrate 2 beneath the gate electrode 4 to form a related gradual junction source and drain regions 7 of the transistor 1. Where these transistors 1 are formed in non-volatile memory cells, the source/drain regions 7 are the bit lines of the memory cell.

Advantageously, the MOS transistors 1 formed in accordance with this embodiment of the invention have a longer channel region than conventional MOS transistors since, as mentioned above, the implanted regions 6 are formed spaced away from the sidewalls of the gate electrode 4. This allows the MOS transistors to have a longer channel region without this involving changes in the dimensions of the gate electrode, and without changes in the thermal treatments which conventional transistors undergo.

A second embodiment of the invention includes, following the formation of the gate electrodes 4, forming a covering dielectric layer 5 over the gate electrode 4 and around the gate electrode 4. In contrast to the first embodiment, this covering dielectric layer 5 is advantageously obtained by oxidizing the entire exposed surface.

A first ion implanting step is carried out next using arsenic ions, for example, at a low dopant dosage to define first implanted regions 6a adjacent to the gate electrode 4. Advantageously, providing the covering dielectric layer 5 prevents these first implanted regions 6a from becoming aligned to the sidewalls of the gate electrode 4, and keeps them a distance away from the sidewalls which is equal to the thickness of the covering oxide layer 5.

A planarization dielectric layer 11 is then deposited onto the whole area of the substrate surface 2. Advantageously, this planarization dielectric layer 11 is that used for forming spacers.

A second ion implantation is carried out next using arsenic ions, for example, at a higher dopant dosage than in the previous implantation to define second implanted regions 6b adjacent to the gate electrode 4. These second implanted regions 6b are not aligned to the sidewalls of the gate electrode 4, but rather at a spacing from the sidewalls equal to the thickness of the planarization oxide layer 11.

A thermal treatment is then applied to diffuse the implanted regions 6a and 6b into the substrate 2 under the gate electrode 4 and form gradual junction source/drain regions 7 of the transistors 1.

Where these transistors 1 are formed in non-volatile memory cells, the source/drain regions 7 are the bit lines of the memory cell.

Devices formed by the processes of embodiments of this invention allow longer channel regions to be provided than in conventional devices.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing a MOS transistor integrated in a semiconductor substrate having a first conductivity type, the process comprising:

forming a gate oxide layer over the semiconductor substrate;

forming a gate electrode over the gate oxide layer;

forming a covering oxide layer over the gate oxide layer, the gate electrode, and area around said gate electrode, wherein forming a covering oxide layer comprises depositing the covering oxide layer onto the gate oxide layer, the gate electrode, and area around said gate electrode to a thickness of 500 Angstroms;

implanting a dopant of a second conductivity type to form implanted regions in the semiconductor substrate and adjacent to the gate electrode;

thermally treating the semiconductor substrate to allow said implanted regions to diffuse into the semiconductor substrate under the gate electrode and to form gradual junction drain and source regions of said transistor.

2. The process for manufacturing a MOS transistor according to claim 1, wherein forming a covering oxide layer comprises forming oxide on all surfaces of the semiconductor substrate able to be oxidized.

3. The process for manufacturing a MOS transistor according to claim 1, wherein implanting a dopant of a second conductivity type comprises:

implanting a first implantation at a low energy dosage over the entire exposed surface of the semiconductor substrate to provide first implanted regions;

depositing an additional oxide layer onto the exposed surface and around the gate electrode; and implanting a second implantation at a high energy dosage over the entire exposed surface to provide second implanted regions.

4. A process for manufacturing a non-volatile memory cell comprising a MOS transistor integrated in a semiconductor substrate having a first type of conductivity, the process comprising the steps of:

forming a layer of gate oxide over the semiconductor substrate;

forming a gate electrode over the layer of gate oxide;

forming a layer of covering oxide over the layer of gate oxide, the gate electrode, and around said gate electrode;

implanting a first implantation at a low energy dosage through the layer of covering oxide to provide first implanted regions spaced laterally from opposite sides of the gate electrode;

depositing of an additional oxide layer onto the exposed surface and around the gate electrode;

implanting a second implantation at a high energy dosage through the additional oxide layer to provide second implanted regions; and subjecting the semiconductor substrate to thermal treatments, after the first and second implantations are implanted, to allow said implanted regions to diffuse into the semiconductor substrate under the gate electrode and form gradual junction bit lines of the non-volatile memory cell.

5. The process for manufacturing a non-volatile memory cell comprising a MOS transistor according to claim 4, wherein said layer of covering oxide is formed by oxidation of the gate electrode and a surface of the semiconductor substrate.

6. A method for forming one or more non-volatile memory cells each including an MOS transistor that is integrated in a semiconductor substrate having a first conductivity type, the method comprising:

forming a gate oxide layer over the semiconductor substrate;

forming a first gate electrode on the gate oxide layer;

forming interpoly dielectric layer on the first gate electrode;

forming a second gate electrode on the interpoly dielectric layer, the second gate electrode having a first vertical side, a second vertical side, and a horizontal top;

forming a covering oxide layer over the gate oxide layer, the first and second vertical sides of the second gate electrode, and the horizontal top of the second gate electrode, the covering layer having a thickness of at least 500 Angstroms;

implanting a first quantity of dopant of a second conductivity type to form implanted regions in the semiconductor substrate and adjacent to the gate electrode; and thermally treating the semiconductor substrate to cause the implanted regions to diffuse into the semiconductor substrate under the gate electrode, forming gradual junction drain and source regions of the MOS transistor.

7. The method of claim 6, wherein forming a covering oxide layer comprises depositing the covering oxide layer onto the gate oxide layer, the first and second vertical sides of the gate electrode, and the horizontal top of the gate electrode.

8. The method of claim 6, wherein forming a covering oxide layer comprises growing the covering oxide layer on the gate oxide layer, the vertical sides of the gate electrode, and the horizontal top of the gate electrode.

9. The method of claim 6 further comprising, before thermally treating the semiconductor substrate:

forming an additional oxide layer over the covering oxide layer; and implanting a second quantity of dopant of the second conductivity type to form second implanted regions in the semiconductor substrate and adjacent to the first implanted regions.

10. The method of claim 9 wherein forming an additional oxide layer over the covering oxide layer comprises depositing a planarization dielectric layer suitable for forming spacers onto the whole area of the substrate surface.

11. An MOS transistor for a non-volatile memory cell that is integrated in a semiconductor substrate having a first conductivity type formed by:

depositing a gate oxide layer over the semiconductor substrate;

depositing a gate electrode over the gate oxide layer, the gate electrode having a first vertical side, a second vertical side, and a horizontal top;

forming a covering oxide layer over the gate oxide layer, the vertical sides of the gate electrode, and the horizontal top of the gate electrode, the covering layer having a thickness of at least 500 Angstroms;

implanting a first quantity of dopant of a second conductivity type to form implanted regions in the semiconductor substrate and adjacent to the gate electrode; and thermally treating the semiconductor substrate to cause the implanted regions to diffuse into the semiconductor substrate under the gate electrode, forming gradual junction drain and source regions of the MOS transistor.

12. The MOS transistor of claim 11, wherein forming a covering oxide layer comprises depositing the covering oxide layer onto the gate oxide layer, the vertical sides of the gate electrode, and the horizontal top of the gate electrode.

13. The MOS transistor claim 11, wherein forming a covering oxide layer comprises growing the covering oxide layer on the gate oxide layer, the vertical sides of the gate electrode, and the horizontal top of the gate electrode.

14. The MOS transistor of claim 11 further formed by, before thermally treating the semiconductor substrate:

forming an additional oxide layer over the covering oxide layer; and implanting a second quantity of dopant of the second conductivity type to form second implanted regions in the semiconductor substrate and adjacent to the first implanted regions.

15. The MOS transistor of claim 14 wherein forming an additional oxide layer over the covering oxide layer comprises depositing a planarization dielectric layer suitable for forming spacers onto the whole area of the substrate surface.

\* \* \* \* \*